(12) United States Patent
Otsuki

(10) Patent No.: US 7,642,625 B2
(45) Date of Patent: Jan. 5, 2010

(54) METHOD OF EVALUATING THERMAL STRESS RESISTANCE OF SEMICONDUCTOR DEVICE, AND SEMICONDUCTOR WAFER HAVING TEST ELEMENT

(75) Inventor: Kazutaka Otsuki, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/139,717

(22) Filed: Jun. 16, 2008

(65) Prior Publication Data

US 2008/0308800 A1 Dec. 18, 2008

(30) Foreign Application Priority Data

Jun. 15, 2007 (JP) ............... 2007-158203

(51) Int. Cl.
*H01L 23/544* (2006.01)
*H01L 29/10* (2006.01)

(52) U.S. Cl. ................. 257/620; 257/48; 257/E21.523; 257/E21.524; 438/462

(58) Field of Classification Search .................. 257/48, 257/620, E21.523, E21.524; 438/462
See application file for complete search history.

(56) References Cited

U.S. PATENT DOCUMENTS

| | | | | |
|---|---|---|---|---|
| 5,285,082 | A * | 2/1994 | Axer | 257/48 |
| 7,294,937 | B2 * | 11/2007 | Su et al. | 257/797 |
| 7,554,211 | B2 * | 6/2009 | Kida et al. | 257/797 |
| 7,563,694 | B2 * | 7/2009 | Burnside et al. | 438/462 |
| 2008/0017856 | A1 * | 1/2008 | Fujino | 257/48 |

FOREIGN PATENT DOCUMENTS

| | | |
|---|---|---|
| JP | 02-179486 | 7/1990 |
| JP | 06-005663 | 1/1994 |

* cited by examiner

*Primary Examiner*—Ngan Ngo
(74) *Attorney, Agent, or Firm*—Young & Thompson

(57) ABSTRACT

A thermal stress resistance evaluating method of a semiconductor device includes: forming a test circuit on a corner of each of unit regions arranged on a wafer in an array arrangement; forming a TEG chip by dicing a TEG chip region which is determined by grouping at least two of the unit regions in a predetermined shape; assembling a packaged TEG chip from the TEG chip; and executing a temperature cycling test on the packaged TEG chip by using the test circuit on the TEG chip. According to such a configuration, by adjusting the predetermined shape, the packaged TEG chip of various sizes can be formed in accordance with the design of the product chip size.

6 Claims, 6 Drawing Sheets

METHOD OF EVALUATING THERMAL STRESS RESISTANCE OF SEMICONDUCTOR DEVICE, AND SEMICONDUCTOR WAFER HAVING TEST ELEMENT

INCORPORATION BY REFERENCE

This Application is based on Japanese Patent Application No. 2007-158203. The disclosure of the Japanese Patent Application is incorporated herein by reference.

BACKGROUND OF THE INVENTION

1. Field of the Invention

The present invention relates to a method of evaluating a semiconductor device, such as an evaluation of a thermal stress resistance property and the like. The present invention also relates to a semiconductor wafer having a test element.

2. Description of the Related Art

In the manufacturing process of a semiconductor device, a semiconductor chip is formed in a wafer. The semiconductor chip is diced and packaged and then shipped as a product. In order to insure that the packaged product excellently operates after the shipping, the various tests such as the temperature cycling test and the like are executed.

(A) Arranging Inhibited Region of Chip Corner

In the temperature cycling test, there is a case that a phenomenon which must be avoided in product occurs. As examples of such a phenomenon, the generation of a crack on a passivation layer and the metal interconnection slide, which are caused by temperature variation are listed. The layer crack and interconnection slide are caused by the generation of the thermal stress caused by the difference of the coefficient of thermal expansion between the passivation layer of the semiconductor chip, the metal interconnection of the semiconductor chip and the molding resin (also, there is cases of different material) covering on the semiconductor chip.

In some cases, in order to avoid such a phenomenon, the arrangement of elements and interconnections on the chip corners of the semiconductor device is inhibited. The distribution of the thermal stress on a semiconductor chip is shown in FIG. 1, in which the thermal stress is maximal in the chip corner region which is farthest from the center of the semiconductor chip. Therefore, it is possible to avoid the foregoing phenomena by employing preventive measures for inhibiting elements and metal interconnections from being arranged on the chip corners. The size of the arrangement inhibited region is determined experientially.

(B) Evaluating TEG

In order to insure that a packaged product is good, a test chip having an evaluation TEG (Test Element Group) is used. FIGS. 2, 3 show examples of the test chip formed on the wafer.

A test chip 3, which has the same size as the design size of the product semiconductor chip, is formed on the wafer 1. In the example of FIG. 2, the size of the semiconductor chip is represented by A×B (the lateral width A and the longitudinal width B). Thus, the size of the test chip 3 to evaluate the semiconductor chip is also represented by A×B. In the example of FIG. 3, the size of the semiconductor chip is represented by C×B. Hence, the size of the test chip 3 to evaluate the semiconductor chip is also represented by C×B.

In a certain stage of designing the semiconductor chip, in order to verify the property of the packaged product, the test chip adapted to the design size of the semiconductor chip in that stage is formed and mounted on the package. After the result of the evaluation for the property of this packaged test chip is checked to be good, the product semiconductor chip is packaged.

In Japanese Laid Open Patent Application JP-A-Heisei, 2-179486, a method for evaluating a thermal stress resistance property of a resin sealed type semiconductor device is described. The TEG pattern described in this document contains interconnections 101, arranged parallel to the two sides of the chip and bent at a right angle on the diagonal of the chip and repeatedly arranged at a constant pitch 105 from the chip end to the center, as shown in FIG. 4. According to this document, since the foregoing TEG chip is used, the various factors with regard to the passivation layer crack and the metal interconnection slide can be evaluated quantitatively and systematically.

In Japanese Laid Open Patent Application JP-A-Heisei, 6-5663, a test semiconductor device on which a plurality of test elements are formed is described. This test semiconductor device is characterized in that, an activated region in which the elements are formed is separated into a plurality of regions by a scribe region formed in the shape of a grid, and one or two or more bonding pads are arranged in the plurality of thus-formed regions.

(A) The arrangement inhibited region formed at the chip corner can be an obstacle for the reduction of the chip size. Thus, the arrangement inhibited region is desired to be requisite minimum size. The size of the arrangement inhibited region is desired to be quantitatively determined based on a certain data.

(B) When the test chip is used, the size of the test chip is formed in accordance with the design size of the semiconductor chip. However, there is a case that the size of the semiconductor chip is changed because of some reasons occurred in designing. Therefore, a technique is desired which enables the size of the test chip to be changed, in accordance with the design change of the semiconductor chip.

SUMMARY (A) It has now been discovered that the arrangement inhibited region formed at the chip corner can be an obstacle for the reduction of the chip size. Thus, the arrangement inhibited region is desired to be requisite minimum size. The size of the arrangement inhibited region is desired to be quantitatively determined based on a certain data.

(B) Also, it has now been discovered that when the test chip is used, its size is determined in accordance with the design size of the semiconductor chip. However, there is a case that the size of the semiconductor chip is changed because of some reasons occurred in designing. Therefore, a technique is desired which enables the size of the test chip to be changed, in accordance with the design change of the semiconductor chip.

According to an aspect of the present invention, a thermal stress resistance evaluating method of a semiconductor device includes: forming a test circuit on a corner of each of a plurality of unit regions arranged on a wafer in an array arrangement; forming a TEG chip by dicing a TEG chip region which is determined by grouping at least two of the plurality of unit regions in a predetermined shape; assembling a packaged TEG chip from the TEG chip; and executing a temperature cycling test on the packaged TEG chip by using the test circuit on the TEG chip.

According to another aspect of the present invention, a semiconductor wafer includes: a substrate; a plurality of test elements formed on the substrate; a plurality of unit chips on each of which a first test element of the plurality of test elements is formed and each of which is able to be mounted on a package to be evaluated; and a scribe line configured to surround each of the plurality of unit chips and on which a second test element of the plurality of test elements having a same circuit configuration to the first test element.

According to further another aspect of the present invention, a manufacturing method of a semiconductor product includes: providing a semiconductor wafer according to the present invention; forming a first test chip composed of two or more of the plurality of unit chips by dicing the semiconductor wafer; and mounting the first test chip on a semiconductor package.

According to the present invention, the data representing the layout restriction on the chip corner can be obtained quantitatively and depending on the chip size. As a result, it is possible to effectively use the corner region of the product chip which is usually empty.

Also, according to the present invention, when the design size of the semiconductor chip which is the target of the evaluation is changed, the test chip to evaluate the property of the semiconductor is not required to be re-designed, and the test chip adapted to the size after design change can be obtained.

BRIEF DESCRIPTION OF THE DRAWINGS

The above and other objects, advantages and features of the present invention will be more apparent from the following description of certain exemplary embodiments taken in conjunction with the accompanying drawings, in which.

DESCRIPTION OF THE PREFERRED EMBODIMENTS

Hereinafter, a semiconductor device according to embodiments of the present invention will be described with reference to the attached drawings.

Figure 1:
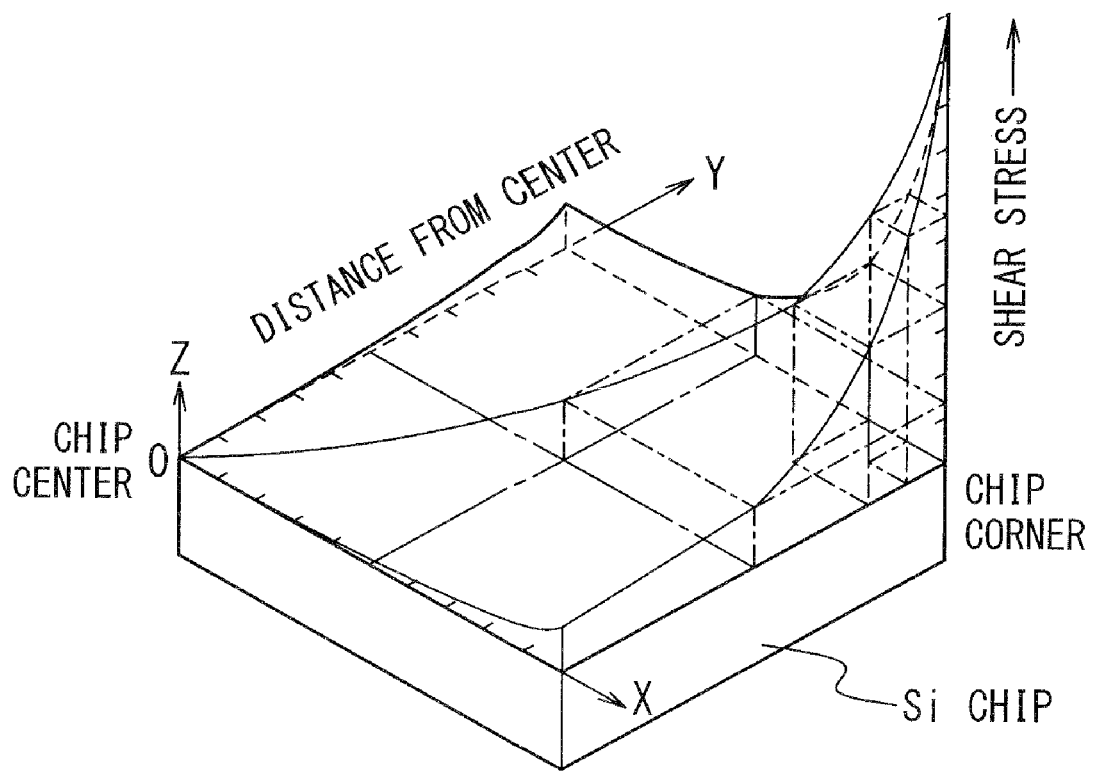
FIG. 1 shows a relation between a distance from a chip center and a thermal stress distribution.
Figure 2:
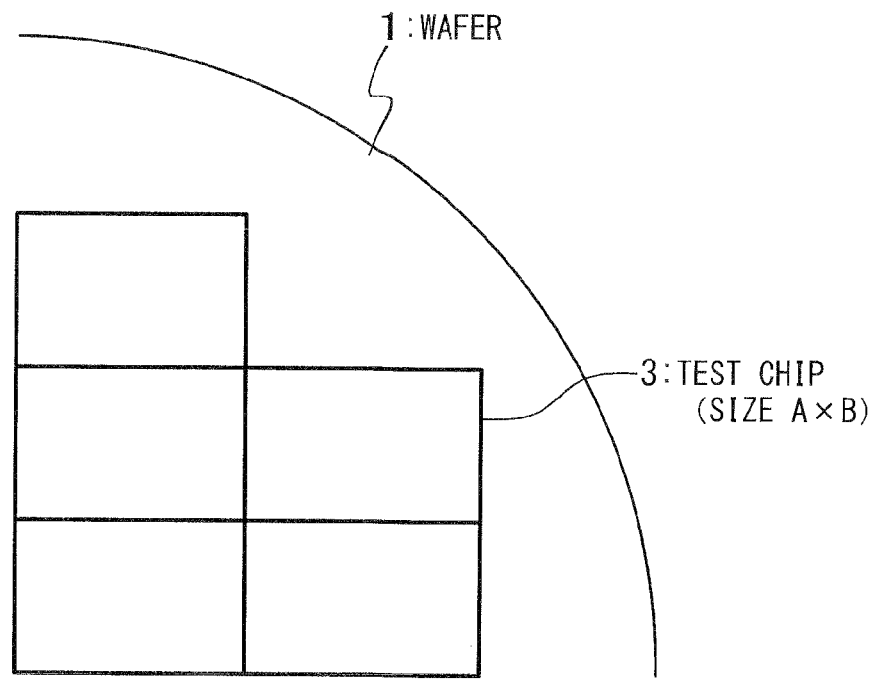
FIG. 2 shows test chips formed on a wafer.
Figure 3:
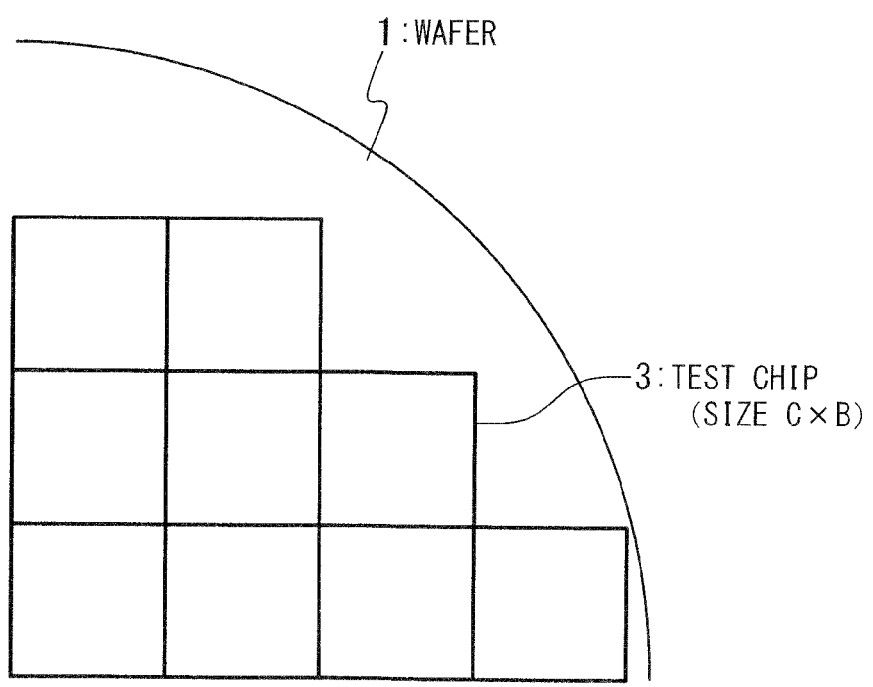
FIG. 3 shows test chips formed on a wafer.
Figure 4:
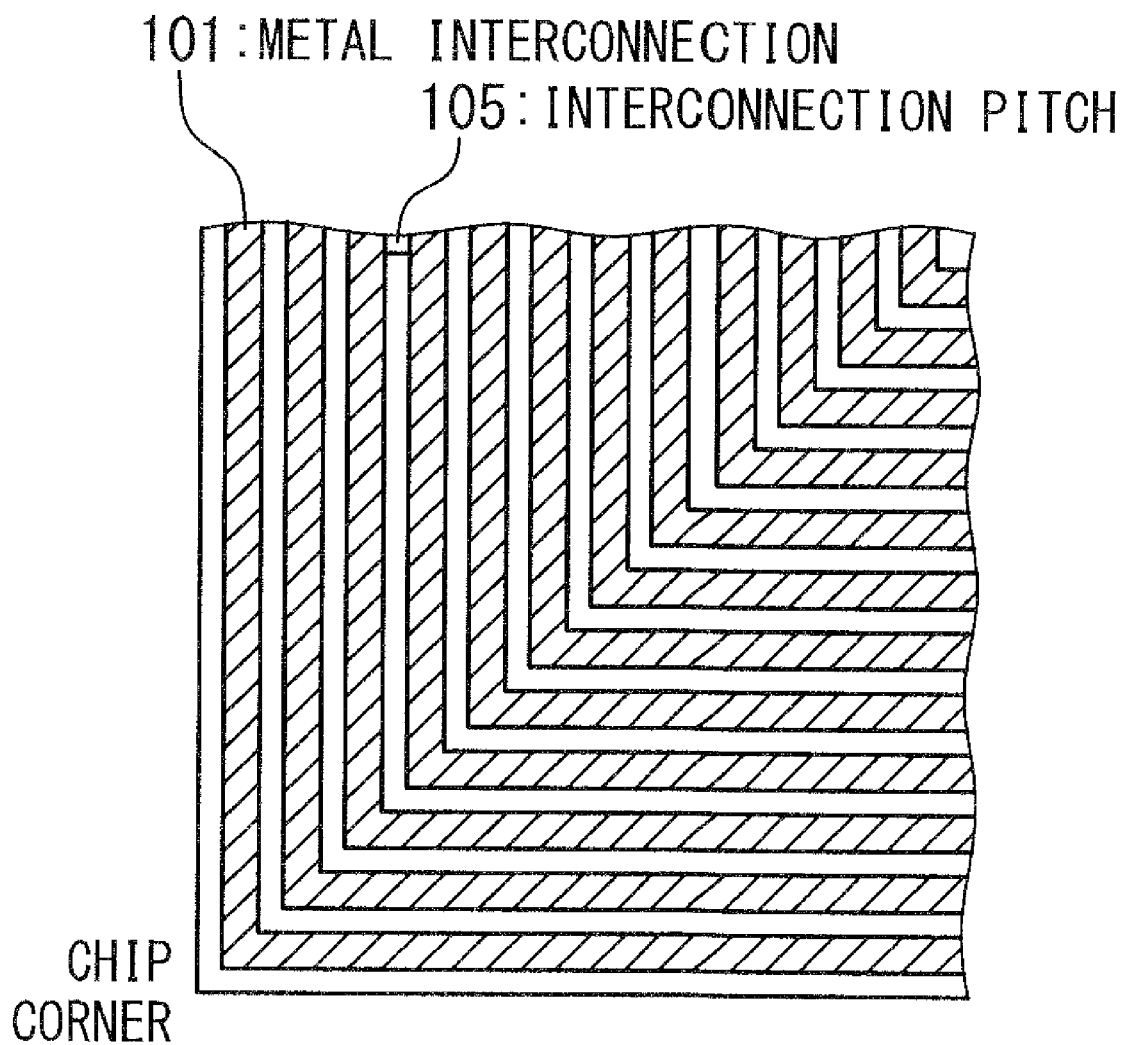
FIG. 4 shows a corner of a test chip.
Figure 5:
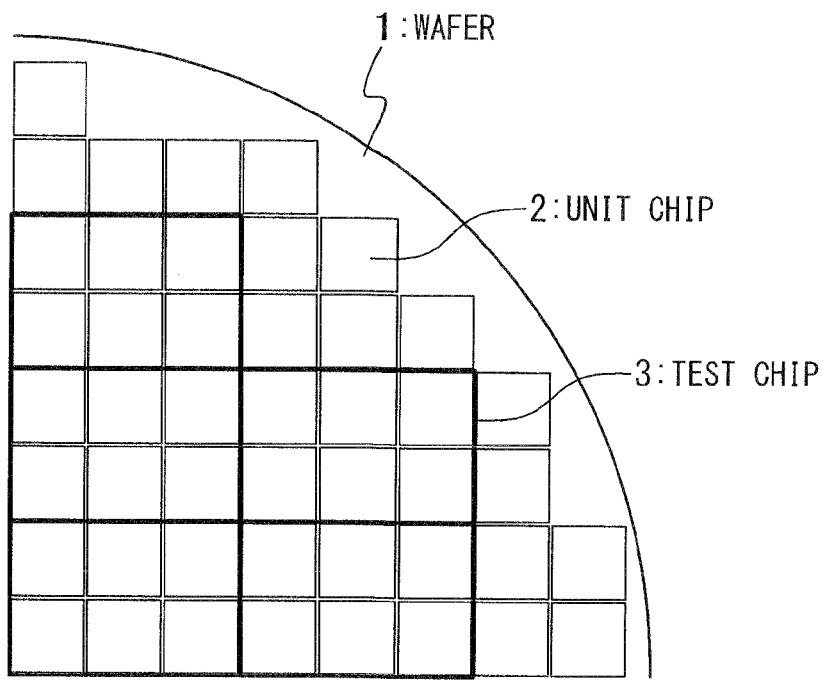
FIG. 5 shows a relation between unit chips and test chips on a wafer.

Embodiments of the present invention will be described below with reference to the accompanying drawings. FIG. 5 shows a test chip (TEG chip) formed on a wafer in a first embodiment. The test chip 3 in this embodiment is formed by grouping unit chips 2 formed on a wafer 1, in the predetermined shape including the two or more unit chips 2. The unit chips 2 are arranged on the wafer 1, in an array pattern extending to two directions of an x-direction and a y-direction orthogonal to each other. The sizes of the plurality of unit chips 2 are preferred to be equal to each other. In the following description, the size in the x-direction of the unit chip 2 is represented by "a", and the size in the y-direction is represented by "b".

Figure 6:
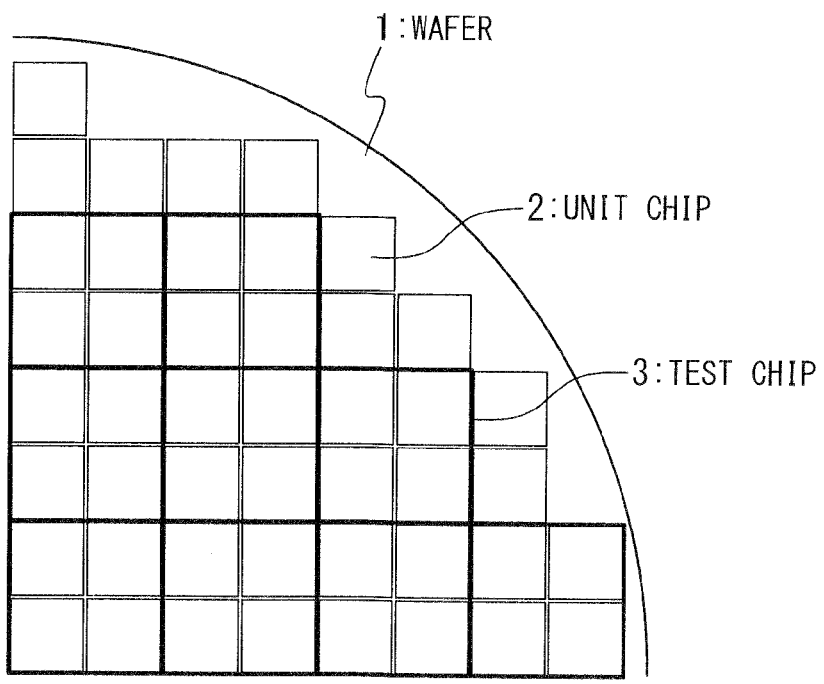
FIG. 6 shows a relation between unit chips and test chips on a wafer.

Each of a, b has the size equal to a fraction of the size of the test chip to evaluate the property when the semiconductor chip is packaged. In the example of FIG. 5, a total of six unit chips arranged in two rows and three columns correspond to one test chip 3. That is, when the size in the x-direction of the test chip 3 is assumed to be A, and the size in the y-direction is assumed to be B, A=3*a and B=2*b. FIG. 6 shows another example of the size of the test chip 3. In this example, a total of four unit chips 2 arranged in two rows and tow columns correspond to one test chip 3. That is, when the size in the x-direction of the test chip 3 is assumed to be C, and the size in the y-direction is assumed to be B (which are equal to the example of FIG. 5), C=2*a and B=2*b.

Each of the unit chips 2 has four corner regions. The corner region is the region near the position that is the farthest from the center of the respective unit chip 2, namely, the region near the four vertexes of the respective unit chip 2 which occupies a quadrangular region on the wafer surface. For each unit chip 2, the TEG is formed in at least one of the corner regions. Preferably, the TEGs are formed in the four corners of each unit chip 2. In the TEG, the transistor patterns of the cell array having a certain level of size, resistor and capacitor patterns are formed in order to verify the property of the product semiconductor chip. That is, the TEG has preferably a size that allows the formation of a circuit including a plurality of electrode pads and semiconductor elements connected between the pads.

The unit chip 2 can be singly assembled and evaluated. That is, each of the unit chips 2 can be singly diced and connected to a predetermined test package or the like so that a packaged TEG chip used for test is assembled. Then, through the pads of each unit chip 2, it is possible to evaluate electric properties and the like of the test element (test element 5 which will be described later) formed on the unit chip 2.

Figure 7:
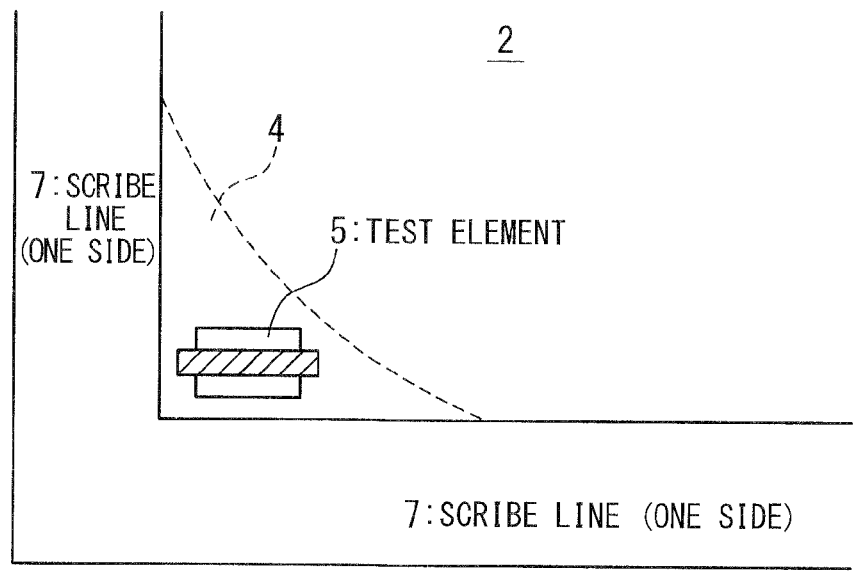
FIG. 7 shows a corner of the unit chip.

FIG. 7 shows a corner region of the unit chip 2. Each unit chip 2 is surrounded with a scribe line 7. The corner region 4 is adjacent to the scribe line 7. The TEG is generated in the corner region 4 of the unit chip 2. The test element 5 configuring the TEG is drawn on FIG. 7. The corner region 4 in the unit chip 2 in which the test element 5 is formed as mentioned above also serves as a corner region of the test chip 3.

When a semiconductor device is designed and manufactured, the foregoing test chip 3 is used as follows. At first, the design of the semiconductor chip is launched. At a certain stage of the designing, let us suppose that the designed size of the semiconductor chip is represented by C*B (C is the value in the x-direction, and B is in the y-direction). The B and C are the values used in the explanation of FIG. 6.

In order to evaluate the property of the semiconductor chip at this stage of designing, the test chip 3 having the same size as the design of the semiconductor chip is be formed by dicing the wafer 1 on which the unit chips 2 are formed, with the region including the unit chips 2 arranged in the two rows and the two columns as a unit.

There is a case that the design of the semiconductor chip is changed so that the size thereof is also changed. For example, let us suppose that the design size of the semiconductor chip is changed from C*B to A*B by using A and B that are used in the explanation of FIG. 5.

In this case, in order to evaluate the property of the semiconductor chip after the design change, the test chip 3 having the same size as the current design of the semiconductor chip may be formed, by dicing the wafer 1 on which the unit chips 2 are formed, with the region including the unit chip 2 arranged in the three rows and the two columns as the unit.

That is, the size of the test chip 3 can be specified at an integer multiple of the size of the unit chip 2. Thus, the size of the test chip 3 can be selected within the following ranges of the combinations of an X-size and a Y-size.

(Test chip X Size)=(Unit Chip X size)×(Integer);

and (Test chip Y Size)=(Unit Chip Y size)×(Integer).

Thus, the size of the test chip 3 can be changed without re-designing the test chip 3.

Moreover, after the test chip 3 of a first horizontal and vertical size is cut away from the wafer 1, when the design of the semiconductor chip is changed, the test chip 3 of a second horizontal and vertical size can be cut away from the wafer 1, in accordance with the design change. Namely, it is possible to form the test chips 3 whose sizes are different to each other from the same wafer 1.

The thus-formed test chip 3 is placed on the package targeted for the evaluation, and the bonding wires are connected to the TEG including the test element 5 to form the test package. This test package is used to execute various tests, for example, the temperature cycling test. Also, before and after the temperature cycling test, the electric property of the test pattern (TEG) is measured, thereby comparing and checking the difference between the properties before and after the temperature cycling test. Moreover, after the temperature cycling test, the package is opened, and the chip surface is observed, thereby checking the presence or absence of cracks of the passivation layer and the metal interconnection slide and the degree of the slide.

Figure 8:
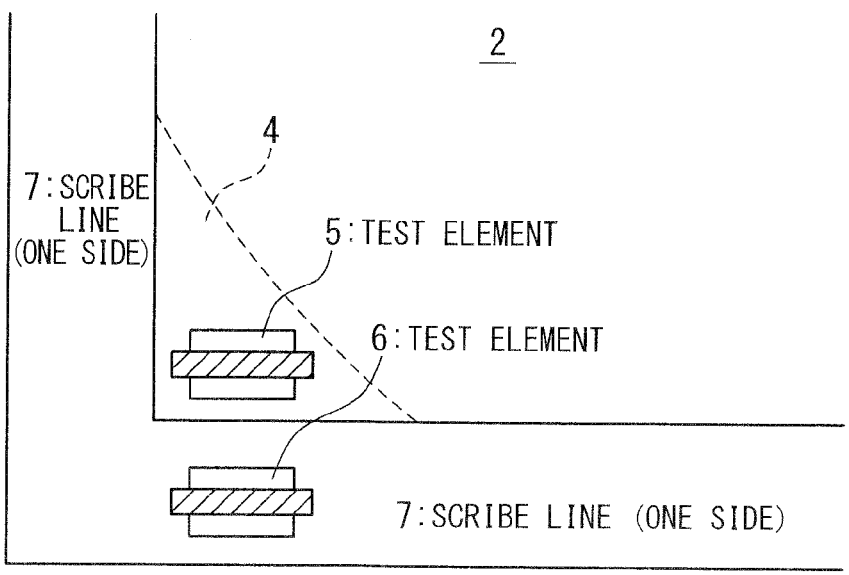
FIG. 8 shows a corner of the unit chip.
Figure 9:
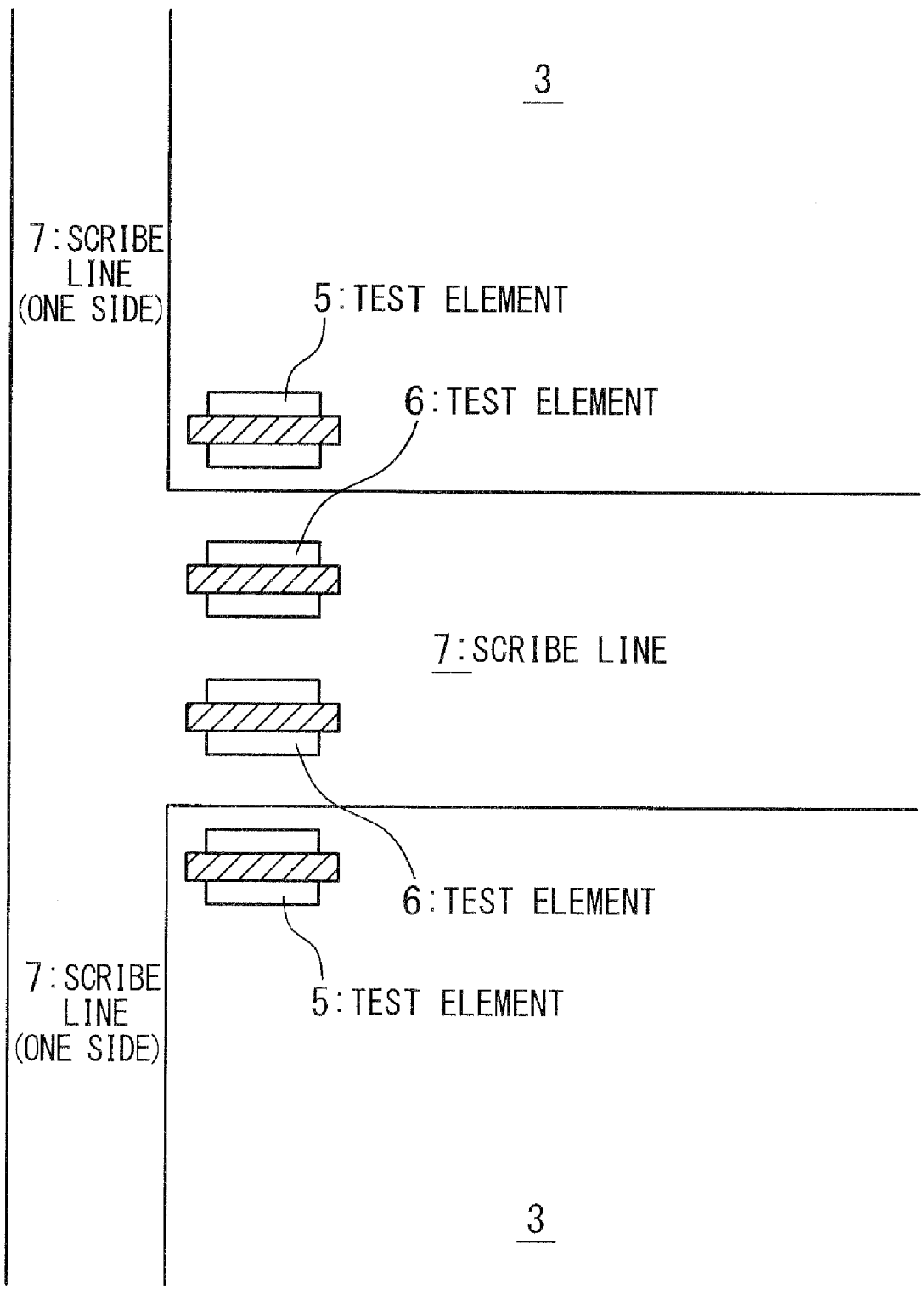
FIG. 9 shows an outer circumference of a test chip.

FIG. 8 shows the corner region of the unit chip 2 in a second embodiment, and FIG. 9 shows a part of the test chip 3 composed of the unit chips 2. In this embodiment, in addition to the configuration of the first embodiment, a test element 6 is formed on the scribe line 7 (the line set between the chips as the region on which the scribe is performed at the dicing step) set on the wafer 1 adjacent to the corner region 4 in the unit chip 2. This test element 6 configures the test pattern to evaluate the thermal stress resistance property. As this test pattern, transistors, resistors or metal interconnections are arranged symmetrically with respect to the center of the unit chip 2. Or, they are arranged on the four corner regions of each unit chip 2. On FIG. 9, the test element 6 adjacent to one test chip 3 and the test element 6 adjacent to the other test chip 3 adjacent to the test chip on the wafer 1 are drawn. The test elements 6 are desired to be arranged on a certain unit chip 2, on the scribe line 7 surrounding the unit chip 2, and on the other unit chip 2 adjacent to the certain unit chip via the scribe line 7 at a constant pitch.

The wafer 1 on which the unit chips 2 and the test elements 5, 6 are formed as mentioned above is diced in accordance with the design size of the product semiconductor chip similarly to the first embodiment. The test chip 3 cut away by the dicing has the test elements 5, 6 formed on the edges of the unit chip 2 included in the test chip 3. The test elements 5, 6 formed on the scribe lines 7 that is not scribed by dicing can be used for the evaluation by which the property variation or the differences of the property variations of adjacent elements. Also, the temperature cycling test can be executed, and by using the test elements 5, 6 at those positions, the difference between the properties and the difference between the property variations before and after the temperature cycling test can be evaluated.

Moreover, after the dicing, the property difference between the test elements 5 located in the corner region of the test chip 3 and the test elements located on the scribe line 7 that is not diced, for example, the test elements 5, 6 of the unit chip 2 located around the center of the test element 5 is evaluated before and after the temperature cycling test. The property variation occurs depending on the distribution of the thermal stress can be evaluated.

In the above explanations, the thermal stress evaluation has been described as the example. However, when the test element that is composed of: the plurality of unit chips according to the present invention; and the scribe lines sandwiched between the unit chips are applied, various evaluations can be executed. For example, a test chip is formed to have a larger size than the product chip. Then, it is also possible to execute the property evaluation, which has a large area dependency, such as the interconnection resistance of this chip, the variation in the Tr characteristics and the like, at an accelerating way.

Although the present invention has been described above in connection with several exemplary embodiments thereof, it would be apparent to those skilled in the art that those exemplary embodiments are provided solely for illustrating the present invention, and should not be relied upon to construe the appended claims in a limiting sense.

What is claimed is:

1. A semiconductor wafer comprising:
   a substrate;
   a plurality of test elements formed on the substrate;
   a plurality of unit chips on each of which a first test element of the plurality of test elements is formed and each of which is able to be assembled to form a packaged TEG chip to be evaluated; and
   a scribe line configured to surround each of the plurality of unit chips and on which a second test element of the plurality of test elements having a same circuit configuration to the first test element.

2. The semiconductor wafer according to claim 1, wherein a plurality of selected test elements of the plurality of test elements are arranged in a predetermined direction and formed on a first unit chip of the plurality of unit chips, on a second unit chip of the plurality of unit chips arranged in adjacent to the first unit chip via the scribe line, and on the scribe line arranged between the first unit chip and the second unit chip.

3. The semiconductor wafer according to claim 2, wherein the plurality of selected test elements are arranged in the predetermined direction at a constant pitch.

4. The semiconductor wafer according to claim 3, wherein the plurality of unit chips are same to each other in size.

5. A manufacturing method of a semiconductor product comprising:
   providing a semiconductor wafer according to claim 1;
   forming a first test chip composed of two or more of the plurality of unit chips by dicing the semiconductor wafer; and
   assembling a packaged TEG chip from the first test chip.

6. The manufacturing method according to claim 5, further comprising:
   composing a second test chip composed of a different number of the plurality of unit chips to the first test chip and two or more of the plurality of unit chips by dicing the semiconductor wafer on which the first test chip is formed.

* * * * *